(12) United States Patent
Kammuri (10) Patent No.: US 9,079,378 B2
(45) Date of Patent: Jul. 14, 2015

(54) ELECTROMAGNETIC SHIELDING MATERIAL AND METHOD OF PRODUCING ELECTROMAGNETIC SHIELDING MATERIAL

(75) Inventor: Kazuki Kammuri, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 136 days.

(21) Appl. No.: 13/254,385

(22) PCT Filed: Oct. 16, 2009

(86) PCT No.: PCT/JP2009/067886
§ 371 (c)(1),
(2), (4) Date: Dec. 5, 2011

(87) PCT Pub. No.: WO2010/113343
PCT Pub. Date: Oct. 7, 2010

(65) Prior Publication Data
US 2012/0090887 A1    Apr. 19, 2012

(30) Foreign Application Priority Data

Mar. 31, 2009    (JP) ................................. 2009-085741

(51) Int. Cl.
*H05K 9/00* (2006.01)
*B32B 37/12* (2006.01)
(Continued)

(52) U.S. Cl.
CPC . *B32B 15/08* (2013.01); *B32B 7/12* (2013.01); *B32B 15/09* (2013.01); *B32B 15/20* (2013.01); *H05K 9/0015* (2013.01); *H05K 9/0088* (2013.01); *B32B 2255/06* (2013.01); *B32B 2255/205* (2013.01); *B32B 2307/212* (2013.01)

(58) Field of Classification Search
None
See application file for complete search history.

(56) References Cited

U.S. PATENT DOCUMENTS 4,250,375 A * 2/1981 Tsutsumi et al. ............. 347/205
4,522,880 A   6/1985 Klostermeier et al.
(Continued)

FOREIGN PATENT DOCUMENTS

JP    59-162044      9/1984
JP    10-173385 A    6/1988
(Continued)

OTHER PUBLICATIONS

Non-Patent Literature No. 1—"Beam Deflection Formulae"—<http://www.advancepipeliner.com/Resources/Others/Beams/Beam_Deflection_Formulae.pdf>.*
(Continued)

*Primary Examiner* — David Sample
*Assistant Examiner* — Donald M Flores, Jr.
(74) *Attorney, Agent, or Firm* — Jenkins, Wilson, Taylor & Hunt, P.A.

(57) ABSTRACT

An electromagnetic shielding material 50 comprising a plurality of copper foil composites 10 connected together in a longitudinal direction L, the composite having a copper foil 2 and a resin film 4 which are laminated, wherein an overlapped part 50k of the copper foil composites is adhered with an epoxy based adhesive 6 comprising as main components an epoxy resin and one or more of flexibility providing resins selected from the group consisting of nitrile butadiene rubber, natural rubber, styrene butadiene rubber, butadiene rubber, ethylene propylene rubber, isoprene rubber, urethane rubber and acrylic rubber, and wherein the epoxy based adhesive disposed at the overlapped part of the copper foil composites has a length LA in the longitudinal direction of 1 to 6 mm.

6 Claims, 3 Drawing Sheets

(51) Int. Cl.
B32B 15/08 (2006.01)
B32B 15/09 (2006.01)
B32B 15/20 (2006.01)
B32B 7/12 (2006.01)

(56) References Cited

U.S. PATENT DOCUMENTS

| | | | |
|---|---|---|---|
| 4,675,246 | A | 6/1987 | Kundinger et al. |
| 4,965,408 | A * | 10/1990 | Chapman et al. ............ 174/363 |
| 5,645,921 | A * | 7/1997 | Matsunaga et al. ........... 428/209 |
| 6,217,996 | B1 | 4/2001 | Yamamoto et al. |
| 6,251,507 | B1 | 6/2001 | Yamamoto et al. |
| 6,835,442 | B2 | 12/2004 | Kudo et al. |
| 7,308,752 | B2 | 12/2007 | Tanaka |
| 2002/0155021 | A1 | 10/2002 | Nagai et al. |
| 2003/0132192 | A1 | 7/2003 | Kudo et al. |
| 2004/0074655 | A1* | 4/2004 | Takahashi et al. ........ 174/35 MS |
| 2009/0142607 | A1 | 6/2009 | Narui et al. |
| 2012/0141809 | A1 | 6/2012 | Kanmuri |
| 2013/0056258 | A1* | 3/2013 | Zhang et al. .................. 174/388 |
| 2013/0071676 | A1 | 3/2013 | Kammuri |

FOREIGN PATENT DOCUMENTS

| | | |
|---|---|---|
| JP | 11-63059 | 6/1989 |
| JP | H03-112643 | 5/1991 |
| JP | 04-144187 | 5/1992 |
| JP | 04-223006 | 8/1992 |
| JP | 5-283883 | 10/1993 |
| JP | 07-058477 | 3/1995 |
| JP | A H7-101007 | 4/1995 |
| JP | HEI 07-032307 | 4/1995 |
| JP | HEI 07-290449 | 11/1995 |
| JP | 09-270593 | 10/1997 |
| JP | 10-056289 | 2/1998 |
| JP | H10-058593 | 3/1998 |
| JP | 3009383 | 2/2000 |
| JP | 2000-101004 | 4/2000 |
| JP | 2002-144510 | 5/2002 |
| JP | 2002-217507 | 8/2002 |
| JP | 2002-249835 | 9/2002 |
| JP | 2002-319319 A | 10/2002 |
| JP | 2005-004826 | 1/2005 |
| JP | 2005-015861 | 1/2005 |
| JP | 2005-191443 | 7/2005 |
| JP | 2006-272743 | 10/2006 |
| JP | 2007-110010 | 4/2007 |
| JP | 2007-207812 | 8/2007 |
| JP | 2008-120081 | 5/2008 |
| JP | 2009-108376 | 5/2009 |
| JP | 2009-111203 | 5/2009 |
| JP | 2009-161068 | 7/2009 |
| JP | 2010-100887 | 5/2010 |
| WO | WO 2010/113343 | 10/2010 |
| WO | WO 2011/004664 | 1/2011 |
| WO | WO 2012/008260 | 1/2012 |

OTHER PUBLICATIONS

Asaharu, N., "Member and Metho for Electromagnetically Shielding Electric Wires, or the like". Jun. 26, 1998, (JP10-173385 A), [Translation of—Detailed Description], <http://www4.ipdl.inpit.go.jp/Tokujitu/PAJdetail.ipdl?N0000=60&N0120=01&N2001=2&N3001=H10-173385>.*

Asaharu, N., "Member and Metho for Electromagnetically Shielding Electric Wires, or the like". Jun. 26, 1998, (JP10-173385 A), [Drawings], <http://www4.ipdl.inpit.go.jp/Tokujitu/PAJdetail.ipdl?N0000=60&N0120=01&N2001=2&N3001=H10-173385>.*

International Search Report corresponding to International Application No. PCT/JP2010/059416 dated Aug. 3, 2010.

International Search Report corresponding to International Application No. PCT/JP2011/063770 dated Aug. 23, 2011.

Notification of Transmittal of Translation of the International Preliminary Report on Patentability corresponding to International Patent Application No. PCT/JP2010/059416 dated Feb. 23, 2012.

International Preliminary Report on Patentability corresponding to International Application No. PCT/JP2009/067886 dated Nov. 15, 2011.

International Search Report corresponding to International Application No. PCT/JP2009/067886 dated Nov. 30, 2009.

Notification of Transmittal of Translation of the International Preliminary Report on Patentability (Chapter I or Chapter II of the Patent Cooperation Treaty) corresponding to International Patent Application No. PCT/JP2011/063770 dated Feb. 21, 2013.

Supplementary European Search Report corresponding to European Patent Application No. 09 842 694.3-1303 / 2416639 dated Mar. 21, 2013.

Supplementary European Search Report corresponding to European Patent Application No. 10 796 975.0-1303 / 2439063 dated Apr. 4, 2013.

MCXS Photovoltaic CVD, Shamadzu Corporation, marketing material printed from web site www.shimadzu.com on Mar. 24, 2014.

Supplementary European Search Report corresponding to European Patent Application No. 11806591.1-1803 / 2581220 dated Apr. 15, 2014.

Autograph AGS-X Series Precision Universal Tester, Shamadzu Corporation, marketing material printed from web site www.shimadzu.com on Mar. 22, 2014.

Japanese Industrial Standard JIS Z2241, "Method of tensile test for metallic materials," Japanese Standards Association (1998).

MCSX Photovoltaic CVD, Shamadzu Corporation, marketing material printed from web site www.shimadzu.com on Mar. 24, 2014.

Official Action corresponding to U.S. Appl. No. 13/579,073 dated Jan. 8, 2014.

Official Action corresponding to U.S. Appl. No. 13/579,073 dated Jun. 20, 2014.

Supplementary European Search Report corresponding to European Patent Applicaiton No. 11806591.1-1803 / 2581220 dated Apr. 15, 2014.

Trapezium Lite X data processing reference manual, No. 349-05245A, pp. 1, and 45-46.

Trapezium Lite X, Shamadzu Corporation, marketing material printed from web site www.shimadzu.com on Mar. 22, 2014.

Advisory Action corresponding to U.S. Appl. No. 13/579,073 dated Nov. 13, 2014.

Interview Summary corresponding to U.S. Appl. No. 13/579,073 dated Sep. 25, 2014.

Japanese Industrial Standard JIS K 7127, "Plastics—Determination of tensile properties—Part 3: Test conditions for films and sheets," Japanese Standards Association (1999) (Translation).

Japanese Industrial Standard JIS Z2201, "Test piece for tensile test for metallic materials," Japanese Standards Association (1998) (Translation).

Official Action corresponding to European Patent Application No. 11806591.1-1803 dated May 2, 2014.

Official Action corresponding to U.S. Appl. No. 13/382,360 dated Jul. 17, 2014.

* cited by examiner

ELECTROMAGNETIC SHIELDING MATERIAL AND METHOD OF PRODUCING ELECTROMAGNETIC SHIELDING MATERIAL

FIELD OF THE INVENTION

The present invention relates to an electromagnetic shielding material comprising a plurality of copper foil composites connected together in a longitudinal direction, the composite having a copper foil and a resin film which are laminated, and also relates to a method of producing the electromagnetic shielding material, wherein the electromagnetic shielding material is used in a production line to eliminate a defect in the copper foil composites or is used when the lengths of the copper foil composites are short.

DESCRIPTION OF THE RELATED ART

As an electromagnetic shielding material, a copper foil composite having a copper foil and a resin film which are laminated is used, since it has excellent shielding properties and has improved corrosion resistance by plating Sn to itself. To attach the copper foil composite as the shielding material to the body to be shielded such as a cable, there are a method of winding laterally (spirally) the shielding material around the body to be shielded, and a method of wrapping longitudinally the shielding material therearound, i.e., juxtaposing the shielding material with the cable in an axial direction and wrapping the shielding material around the body to be shielded so that the longitudinal direction of the copper foil composite is equal to the axial direction of the body to be shielded.

When the copper foil is used for the shielding material, in order to add insulation properties and to ease handling, a laminate of the copper foil and a resin film such as PET is used (see Patent Literature 1). Generally, the copper foil laminate material is combined with a drain wire, the copper foil and the drain wire are disposed at the cable side to provide conduction, the PET film is disposed outside, and a sheath material coats the outside of the PET film.
[Patent Literature 1] Unexamined Japanese Patent Publication (Kokai) Hei 7-290449

PROBLEMS TO BE SOLVED BY THE INVENTION

When the shielding process is performed in the production line, the copper foil composite in a coil shape is recoiled with the body to be shielded, and is passed through dies for shielding. If the length of the coil is insufficient, a plurality of the copper foil composites may be connected in a longitudinal direction. The connection is made by fixing or adhering an overlapped or butted part of the plurality of copper foil composites in a longitudinal direction using an adhesive tape or an adhesive such as acrylic resin.

However, when the connected copper foil composites are used for shielding process, a shielded structure such as a sheath material of an electric wire may have a defect including bulge or concave around the connected part.

Accordingly, an object of the present invention is to provide an electromagnetic shielding material and a method of producing the same such that a defect causing a change in the shape of the shielded structure is prevented, when shielding process is performed using the electromagnetic shielding material in which a plurality of the copper foil composites are connected in a longitudinal direction.

SUMMARY OF THE INVENTION

The present inventors found that a defect of a concaved shape in the shielded structure (hereinafter appropriately referred to as "a concave defect") is caused by a decrease in the adhesion strength when the temperature of the connected part of the copper foil composites is increased, and that a defect of a bulged shape in the shielded structure (hereinafter appropriately referred to as "a bulge defect") is caused by increased rigidity and thickness on the connected part of the copper foil composites. The discoveries lead to the present invention.

That is, the present invention provides an electromagnetic shielding material comprising a plurality of copper foil composites connected together in a longitudinal direction, the composite having a copper foil and a resin film which are laminated, wherein an overlapped part of the copper foil composites is adhered with an epoxy based adhesive comprising as main components an epoxy resin and one or more of flexibility providing resins selected from the group consisting of nitrile butadiene rubber, natural rubber, styrene butadiene rubber, butadiene rubber, ethylene propylene rubber, isoprene rubber, urethane rubber and acrylic rubber, and wherein the epoxy based adhesive disposed at the overlapped part of the copper foil composites has a length LA in the longitudinal direction of 1 to 6 mm.

Preferably, a rectangular piece is cut from the overlapped part of the copper foil composites so that the rectangular piece has long sides each having a length of 7 mm in a direction perpendicular to the longitudinal direction, and one of short sides of the rectangular piece is fixed, a force P per unit width required to deflect 3 mm a point apart 5 mm from the fixed side is 5 N/m≤P/w≤15 N/m.

Preferably, $P \times LA <= 45$ mN.

Also, the present invention provides an electromagnetic shielding material comprising a plurality of copper foil composites connected together in a longitudinal direction, the composite having a copper foil and a resin film which are laminated, wherein an overlapped part of the copper foil composites is adhered with an epoxy based adhesive comprising as main components an epoxy resin and one or more of flexibility providing resins selected from the group consisting of nitrile butadiene rubber, natural rubber, styrene butadiene rubber, butadiene rubber, ethylene propylene rubber, isoprene rubber, urethane rubber and acrylic rubber, and wherein the overlapped part of the copper foil composites has adhesion strength per unit width at 150° C. of 1.5 N/mm or more.

The present invention provides a method of producing an electromagnetic shielding material comprising the steps of: overlapping a plurality of copper foil composites in a longitudinal direction, the composite having a copper foil and a resin film which are laminated, and connecting and adhering an overlapped part of the copper foil composites by disposing an epoxy based adhesive comprising one or more selected from the group consisting of nitrile butadiene rubber, natural rubber, styrene butadiene rubber, butadiene rubber, ethylene propylene rubber, isoprene rubber, urethane rubber and acrylic rubber; and an epoxy resin.

According to the present invention, the defect causing a change in shape of the shielded structure is prevented, when shielding process is performed using the electromagnetic shielding shielding material in which a plurality of the copper foil composites are connected in a longitudinal direction.

DESCRIPTION OF THE PREFERRED EMBODIMENTS

The electromagnetic shielding material of the present invention comprises a plurality of copper foil composites connected together in a longitudinal direction, the composite has a copper foil and a resin film which are laminated. Generally, the longitudinal direction is the axial direction around which the body to be shielded is wrapped with the electromagnetic shielding material.

<Copper Foil>

The higher the conductivity (purity) of the copper foil is, the more the shielding properties are improved. Accordingly, the purity of the copper foil is preferably high, i.e., not less than 99.0%, more preferably not less than 99.8%. Preferably, rolled copper foil is used, since it has excellent flexibility. Electrolytic copper foil may be used.

The thickness of the copper foil is preferably 4 to 20 μm, more preferably 4 to 15 μm. If the thickness is less than 4 μm, the shielding properties may be lowered and the strength may be also decreased, which may result in poor productivity. If the thickness exceeds 20 μm, the shielding properties are improved, but the rigidity may be increased, which may make difficult to coat along the subject shape. In addition, spring back may occur after the coating, and a gap may be produced between the shielding materials to reduce the shielding properties. In addition, if the thickness exceeds 20 μm, the shielding material may grow in mass. If the thickness of the copper foil exceeds 15 μm, there are trends that P, which will be described later, may exceed 15 N/m and P×LA may exceed 45 mN, even though the components and the thermal compression bonding conditions of the epoxy based adhesive on the overlapped part are adjusted and LA gets shorten. Therefore, the thickness of the copper foil of 15 μm or less is more preferable.

<Resin Film>

The resin film is not especially limited, but a PET film can be favorably used. Specifically, when a biaxially-oriented polyethylene terephthalate (PET) film is used, the strength can be increased. The thickness of the resin film is not especially limited, but is typically about 7 to 25 μm. If the thickness of the resin film is less than 7 μm, the film may be easily broken in the production line, and may have poor productivity. On the other hand, if the thickness of the resin film exceeds 25 μm, there are trends that P, which will be described later, may exceed 15 N/m and P×LA may exceed 45 mN. Therefore, the thickness of the resin film of about 12 μm is most preferable.

The resin film and the copper foil may be laminated using the adhesive therebetween, or the resin film may be thermal compression bonded to the copper foil without using the adhesive. From the standpoint of adding no extra heat to the resin film, the adhesive is preferably used.

Preferably, the total thickness of the copper foil composite having a copper foil and a resin film which are laminated is about 20 to 40 μm.

<Electromagnetic Shielding Material>

Figure 1:
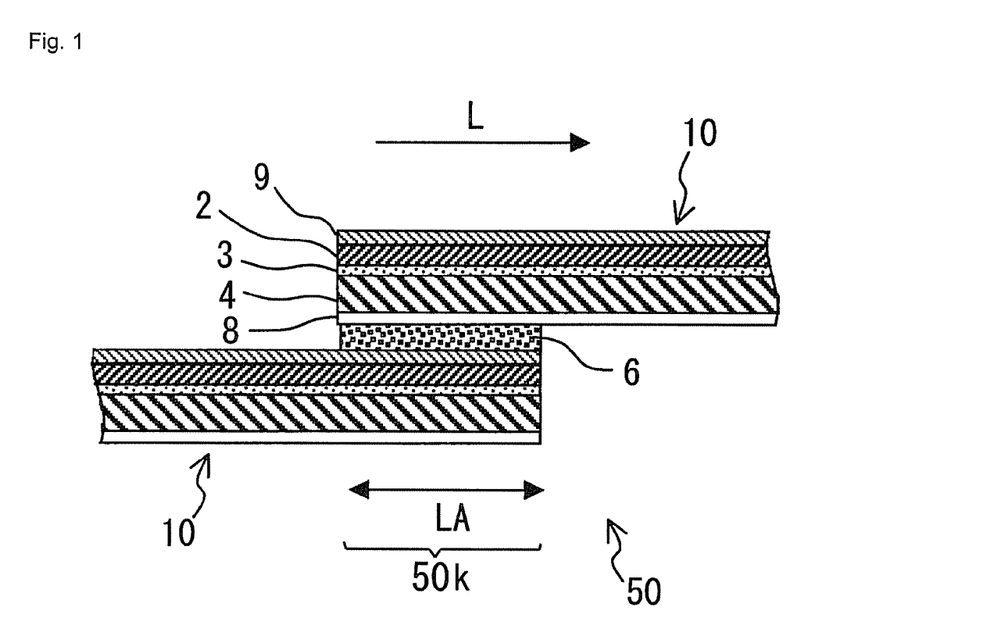
FIG. 1 is a sectional view showing a structure of an electromagnetic shielding material.

FIG. 1 is a sectional view showing a structure of an electromagnetic shielding material 50 where a plurality of copper foil composites 10 are connected in a longitudinal direction L.

The copper foil composite 10 comprises a copper foil 2 having a thickness of 8 μm and a resin film (PET film) 4 having a thickness of 12 μm which are laminated, and an adhesive layer 3 (thickness of 3 μm) is disposed between the copper foil 2 and the PET film 4. In addition, a Sn plating layer 9 having a thickness of 1 μm is formed on the surface of the copper foil 2 in order to improve corrosion resistance (salt tolerance). Furthermore, on the surface of the PET film 4, a thermoplastic adhesive layer 8 (thickness of 3 μm) having no adhesion at normal temperature is formed, in order to adhere the electromagnetic shielding material and the sheath material, or to adhere the ends of the wrapped electromagnetic shielding material, when the outside of the body to be shielded is wrapped with the copper foil composites 10 (electromagnetic shielding materials) to coat the sheath material.

An overlapped part 50k of the ends of two copper foil composites 10 in the longitudinal direction L is adhered and connected with an epoxy based adhesive (layer) 6. Thus, the electromagnetic shielding material 50 is provided. The length LA of the epoxy based adhesive (layer) 6 in the longitudinal direction L is shorter than or equal to that of the overlapped part 50k.

Moreover, the adhesive layer 8 for shielding of the one copper foil composite 10 is overlapped with the Sn plating layer 9 of the other copper foil composite 10 in facing each other.

However, no Sn plating layer 9 may be formed on the copper foil composite 10, or the adhesive layer 8 may not be required. Both the Sn plating layer 9 and the adhesive layer 8 of the copper foil composite 10 may not be required. In these cases, corresponding surfaces of the copper foil composites 10 are overlapped.

<Shielding>

Figure 2:
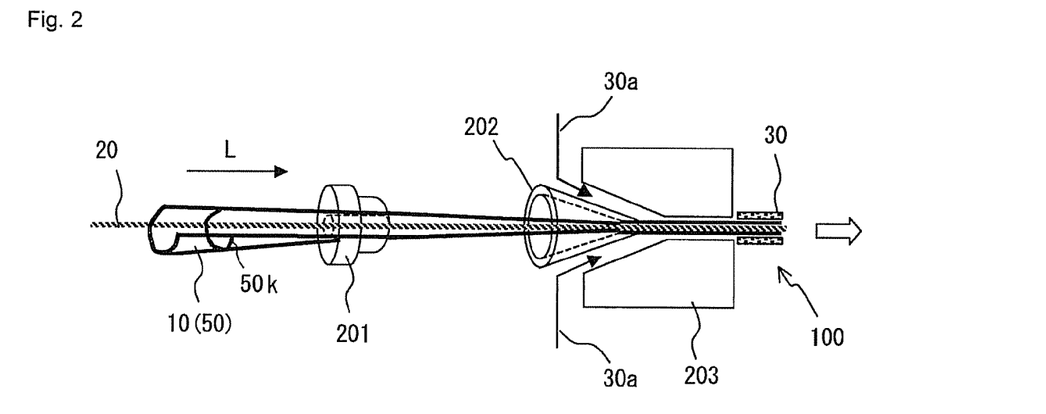
FIG. 2 shows an embodiment of shielding process by wrapping a body to be shielded with a copper foil composite (electromagnetic shielding material)

FIG. 2 shows an aspect of shielding process by wrapping a body to be shielded (core) 20 with a copper foil composite 10 (electromagnetic shielding material 50).

As shown in FIG. 2, the copper foil composite 10 is juxtaposed with the body to be shielded 20 such that the longitudinal direction L of the copper foil composite 10 is equal to the axial direction of the body to be shielded 20, and the body to be shielded 20 is wrapped with the copper foil composite 10 such that the PET film is disposed outside (wrapping longitudinally). Then, the copper foil composite 10 wrapped around the body to be shielded 20 is passed through a first die 201 and a second die 202 to reduce the diameter, and is further passed through a third die 203. At that time, a molten sheath material (such as PVC) 30a is flowed into the outside of the copper foil composite 10. Then a shielded structure (shielding cable) 100 comprising the copper foil composite 10 wrapped with a sheath material 30 therearound is emerged from the third die 203.

At the same time, the overlapped part 50k on the copper foil composites 10 also passes through the dies 201 to 203, and the shielded structure 100 may have the concave defect outside.

Figure 3:
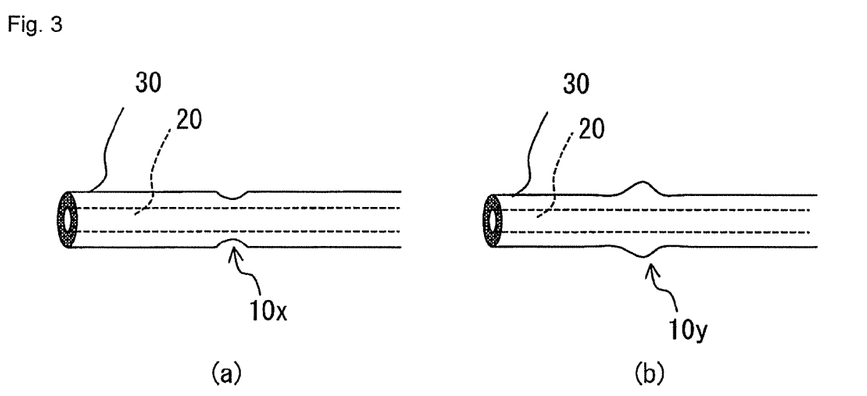
FIG. 3 shows defects of copper foil composites (electromagnetic shielding materials) after passing through dies.

FIG. 3 shows the defects of the shielded structures 100 after passing through the dies 201 to 203. As shown in FIGS. 3(a) and (b), the concave 10x and the bulge by may be produced near the overlapped part 50k.

Through the studies, the present inventors found that the concave defect of the shielded structure is caused by a decrease in the adhesion strength when the temperature of the connected part of the copper foil composites is increased. In other words, when the copper foil composites 10 are passed through the dies 201 to 203 at a holding temperature of about 180° C., the temperature of the copper foil composites is increased to about 150° C. The adhesion strength of the overlapped part 50k at the connected part of the copper foil composites 10 is decreased and the overlapped part 50k is misaligned in the longitudinal direction (which results in the decreased length LA of the connected part 50k), thereby producing the concave defect.

The bulge defect of the shielded structure may be produced as follows: the rigidity and the thickness on the overlapped part 50k are increased to widen the diameter of the body to be shielded on the overlapped part 50k. As a result, the overlapped part 50k is caught on the dies 201 to 203 upon passing therethrough, and the diameter of the shielded structure is widened. Therefore, the front of the overlapped part 50k becomes uneven, to which a great amount of the sheath material 30a is attached.

The present inventors found the epoxy based adhesive described later that holds the adhesion strength of the copper foil composites 10 even at about 150° C., is thin while maintaining the adhesion strength, and has low rigidity.

<Epoxy Based Adhesive>

The overlapped part 50k is adhered with the epoxy based adhesive comprising as main components an epoxy resin and a flexibility providing resin.

Examples of the flexibility providing resin include one or more selected from the group consisting of nitrile butadiene rubber (NBR), natural rubber (NR), styrene butadiene rubber (SBR), butadiene rubber (BR), ethylene propylene rubber (EPDM), isoprene rubber (IR), urethane rubber (PUR) and acrylic rubber (ACM·ANM).

It is conceivable that these rubbers are disposed into cured epoxy skeletons as particles or the like, and absorb plastic deformation energy of the adhesive layer, thereby decreasing the rigidity and providing the flexibility of the epoxy based adhesive.

In particular, from the standpoint of compatibility with the epoxy resin, nitrite butadiene rubber (NBR; acrylonitrile-butadiene copolymer) is preferable.

When the epoxy based adhesive includes a great amount of the flexibility providing resin, the P value and the P×LA value can be decreased, but shear adhesion strength tends to be decreased. If the shear adhesion strength is less than 1.5 N/mm, the overlapped part 50k may be peeled off by the tensile force from the production line.

Although examples of the epoxy resin include bisphenol A type epoxy resin, dicyclopentadiene type epoxy resin, naphthol type epoxy resin, phenol novolac type phenol resin and the like, any known epoxy resins can be used.

Examples of the curing agent include known curing agents for the epoxy resin. For example, various amine based curing agents can be used.

Although the percentage of the epoxy resin and the rubber noted above is not especially limited, about 10 to 400 parts by mass of the rubber may be generally used based on 100 parts by mass of the epoxy resin.

An additive agent such as a filler may be added to the epoxy based adhesive as required. Typically, it is preferable that the amount of the additive agent other than the epoxy resin and the aforementioned rubbers be less than 10 parts by mass based on 100 parts by mass of the epoxy based adhesive.

The above-mentioned epoxy based adhesive can be coated to the overlapped part 50k in the form of an adhesive solution obtained by mixing the epoxy resin, the aforementioned rubbers, the curing agent and other additive agent as needed with an organic solvent. Alternatively, a base film is coated with the adhesive solution to provide an adhesive tape, which can be applied to the overlapped part 50k. Afterwards, the overlapped part 50k into which the epoxy based adhesive is disposed is thermal compression bonded and the epoxy resin is cured, whereby the adhesion is completed.

When the overlapped part 50k is adhered with the epoxy based adhesive, the adhesion strength with the Sn layer 9 is sufficient, but the adhesion strength with the PET film layer 8 (in fact, the adhesive layer 8 for shielding) tend to be decreased. And it is confirmed that the thermal compression bonding temperature is preferably 30° C. or more higher than the glass transition temperature (Tg) of the resin film. Since the Tg of PET is about 110° C., the thermal compression bonding temperature preferably exceeds 140° C. In addition, the thermal compression bonding may be conducted by applying heat after pre-pressure bonding at room temperature. When the thermal compression bonding is conducted by gradually rising the temperature from room temperature to the predetermined temperature, no defect in shape such as wrinkle by the thermal compression bonding is produced.

The length L in the longitudinal direction of the epoxy based adhesive (layer) 6 disposed at the overlapped part 50k is preferably 1 to 6 mm. If the LA is less than 1 mm, the adhesion strength of the overlapped part 50k is decreased and the above-mentioned concave defect may be easily produced. On the other hand, if the LA exceeds 6 mm, the rigidity is increased and the bulge defect may be easily produced.

FIG. 3(b) schematically shows the bulge defect. Although the cause of the bulge defect is not clear, it is considered that the hardness of the overlapped part 50k may affect thereon.

Specifically, a rectangular piece 50s is cut from the overlapped part 50k of the copper foil composites 10 so that the rectangular piece 50s has long sides each having a length of 7 mm in a direction perpendicular to the longitudinal direction L. When one of short side of the rectangular piece 50s is fixed to a fixed wall 300, P, which will be described later, is preferably set to the following value. FIG. 4(a) is a top view of the rectangular piece 50s having one side fixed (the top of the rectangular piece 50s is plane of paper). FIG. 4(b) is a side view (the cut plane of the rectangular piece 50s is plane of paper). Each of the short sides of the rectangular piece 50s is equal to the length LA of the overlapped part 50k.

In FIG. 4(b), downward force is applied apart 5 mm from the fixed side 50e of the rectangular piece 50s to a free end in a direction shown by an arrow. As shown in FIG. 4(c), a force P per unit width of the rectangular piece 50s required to deflect the rectangular piece 50s 3 mm downward is preferably $5$ N/m $\leq$ P/w $\leq$ 15 N/m.

If the P is less than 5 N/m, the adhesion strength of the overlapped part 50k at 150° C. may be less than 1.5 N/mm, and the concave defect may be easily produced. On the other hand, if the P exceeds 15 N/m, the rigidity of the overlapped part 50k is increased and the bulge defect may be easily produced, and even if the LA is controlled within 1 to 6 mm, the concave defect may be produced.

When the copper foil and the resin film are thick, the P is increased. Therefore, if the copper foil and the resin film are thickened, in order to make up for this, the P is adjusted by (1) increasing the compounding ratio of the flexibility providing resin in the epoxy based adhesive to soften, (2) decreasing the thickness of the epoxy based adhesive, (3) decreasing the temperature of the thermal compression bonding of the epoxy based adhesive or the like.

Furthermore, when P×LA<=45 mN, the production of the concave defect can be further inhibited. Here, if the rectangular piece 50s is warped, the above-mentioned P is difficult to be measured precisely. Therefore, the flat copper foil composite is preferably used for measurement before it is wrapped around the body to be shielded.

The adhesion strength of the overlapped part 50k at 150° C. is preferably 1.5 N/mm or more. As mentioned above, the concave defect is caused by the insufficient adhesion strength of the overlapped part 50k. Therefore, when the adhesion strength at 150° C., which is the shielding process temperature, is 1.5 N/mm or more, the adhesion strength is increased and the concave defect can be prevented. When the adhesion strength of the overlapped part 50k at 150° C. is 2 N/mm or more, the concave defect can be advantageously prevented, even if excessive tension may be added under the manufacturing conditions of shielding the body to be shielded with the copper foil composite (electromagnetic shielding material). Here, the adhesion strength of the overlapped part 50k is a tension strength measured by pulling apart two copper foil composites 10 including the overlapped part 50k in the L direction. Accordingly, unlike the above-mentioned P, the copper foil composite (warped in a radial direction) wound to the body to be shielded may be used for measurement.

The thickness of the epoxy based adhesive (layer) 6 is preferably 35 μm or less. If the thickness of the epoxy based adhesive (layer) 6 exceeds 35 μm, as in the case of the LA described above, the overlapped part 50k is hardened and the bulge defect may be produced. The lower limit of the thickness of the epoxy based adhesive (layer) 6 may be decreased, as long as the above-mentioned adhesion strength of the overlapped part 50k at 150° C. is 1.5 N/mm or more with certainty, and the adhesive (layer) can be formed. Generally, the lower limit of the epoxy based adhesive (layer) 6 is about 1 to 2 μm, and about 6 to 25 μm for operability.

Example 1

<Production of a Copper Foil Composite>

A tough pitch copper ingot was hot-rolled, and surface-ground to remove the oxide. The ingot was cold-rolled, annealed, and acid pickled repeatedly to decrease the thickness as thin as 8 μm, and finally annealed to provide the copper foil having workability. The tension upon the cold-rolling and the rolling conditions of the rolled material in a width direction were made uniform so that the copper foil had the uniform composition in a width direction. In the annealing thereafter, a plurality of heaters were used to control the temperature so that the temperature distribution in the width direction was uniform. Specifically, the temperature of the copper was measured and controlled.

A commercially available biaxially-oriented PET film having a thickness of 12 μm was adhered to the above-mentioned copper foil with the adhesive having a thickness of 3 μm. On an opposite surface of the laminated surface of the copper foil and the PET film, a Sn plating layer 9 having a thickness of 1 μm was formed to produce the copper foil composite. The composite was cut to produce predetermined rectangular test pieces.

<Production of an Electromagnetic Shielding Material>

Two test pieces of the cooper foil composites were laminated so that the adhesive layer 8 for shielding of the one copper foil composite 10 was overlapped with the Sn plating layer 9 of the other copper foil composite 10 in facing each other. An epoxy based adhesive tape (a commercially available tape comprising nitrile butadiene rubber (NBR) and epoxy resin) was tucked into the overlapped part 50k, and was subjected to pre-pressure bonding at room temperature, and then thermal compression bonding at the temperature shown in Table 1 (under the pressure of 1 MPa or less) to manufacture the electromagnetic shielding material. The length LA of the epoxy based adhesive tape in the longitudinal direction LA was changed to have the thickness of 25 μm.

By changing the thermal compression bonding temperature and the LA, the electromagnetic shielding materials in Experimental cases 1 to 5 were formed.

<Adhesion Strength>

The adhesion strength of the overlapped part of the resultant electromagnetic shielding material was measured at 150° C. by attaching both ends of the electromagnetic shielding material to the predetermined tensile tester. The width of the test specimen was 11.5 mm.

<Presence or Absence of a Concave Defect>

The resultant electromagnetic shielding material wrapped longitudinally around the predetermined core, and which passed through the predetermined dies to determine visually presence or absence of concave defect.

In Comparative Experimental case 1, the electromagnetic shielding material was produced and evaluated as in Experimental case 5 except that the length LA of the epoxy based adhesive (layer) in the longitudinal direction was 10 mm.

In Comparative Experimental case 2, the electromagnetic shielding material was produced and evaluated as in Experimental case 2 except that the adhesive in the overlapped part 50k was acrylic resin (manufactured by Sumitomo 3M Limited under the trade name of F-9460 PC).

In Comparative Experimental case 3, the electromagnetic shielding material was produced and evaluated as in Comparative Experimental case 2 except that the thermal compression bonding temperature was 180° C. and the LA was 10 mm.

In Comparative Experimental case 4, the electromagnetic shielding material was produced by adhering and fixing the Sn plating face 9 and the adhesive layer 8 faced each other of the above-described two copper foil composites at the overlapped part 50k using an adhesive tape (manufactured by TERAOKA Seisakusho Co., Ltd. under the trade name of 631S) instead of the adhesive 6. The electromagnetic shielding material was similarly evaluated.

The results obtained are shown in Table 1.

|  | Adhesive | thermal compression bonding temperature (° C.) | LA (mm) | Adhesion strength (N/mm) | Concave defect | Bulge defect |
|---|---|---|---|---|---|---|
| Experimental case 1 | NBR/Epoxy resin | 140 | 5 | 1.6 | Absence | Absence |
| Experimental case 2 | " | 150 | 3 | >2 | Absence | Absence |
| Experimental case 3 | " | 160 | 3 | >2 | Absence | Absence |

-continued

|  | Adhesive | thermal compression bonding temperature (° C.) | LA (mm) | Adhesion strength (N/mm) | Concave defect | Bulge defect |
|---|---|---|---|---|---|---|
| Experimental case 4 | " | 170 | 3 | >2 | Absence | Absence |
| Experimental case 5 | " | 180 | 3 | >2 | Absence | Absence |
| Comparative Experimental case 1 | " | 180 | 10 | >2 | Absence | Presence |
| Comparative Experimental case 2 | Acrylic resin | 140 | 3 | 0.7 | Presence | Absence |
| Comparative Experimental case 3 | " | 180 | 10 | 1.1 | Presence | Presence |
| Comparative Experimental case 4 | Adhesive tape | — | — | 1.2 | Presence | Presence |

As apparent from Table 1, in each of Experimental cases 1 to 4, the adhesion strength at 150° C. of the overlapped part of the copper foil composites was 1.5 N/mm or more (18 N/11.5 mm or more), and no concave defect was produced at outside of the copper foil composite.

On the other hand, in Comparative Experimental case 1 where the length LA of the epoxy based adhesive tape in the longitudinal direction exceeded 6 mm, the bulge defect was produced at outside of the electromagnetic shielding material.

In each of Comparative Experimental cases 2 and 3 where the acrylic resin was used as the adhesive at the overlapped part, the adhesion strength at 150° C. of the overlapped part was less than 1.5 N/mm, the concave defect was produced at outside of the electromagnetic shielding material. In Comparative Experimental case 3 where the LA exceeded 6 mm, the bulge defect was produced as well.

In Comparative Experimental case 4 where the adhesive tape was used instead of the adhesive at the overlapped part, the adhesion strength at 150° C. of the overlapped part was less than 1.5 N/mm, the concave defect was produced at outside of the electromagnetic shielding material and the bulge defect was produced as well.

In each of Comparative Experimental cases 2 and 3, since the acrylic based adhesive (layer) was used at the overlapped part instead of the epoxy based adhesive layer, the LA corresponded to the length in the longitudinal direction of the acrylic based adhesive (layer). On the other hand, in Comparative Experimental case 4, the length in the longitudinal direction at the overlapped part was 10 mm, which did not correspond to the LA in other Experimental cases, since there was no adhesive layer in the overlapped part and the adhesive tape of 25 mm was simply adhered to both surfaces at the overlapped part.

Example 2

Using the sample in Experimental case 1, a wedge shape indenter attached to a load cell tip was indented into the overlapped part at the predetermined depth to measure a load required to be indented.

For comparison, the electromagnetic shielding material was produced and evaluated as in Experimental case 1 except that the LA of the adhesive at the overlapped part 50k was 10 mm.

Figure 5:
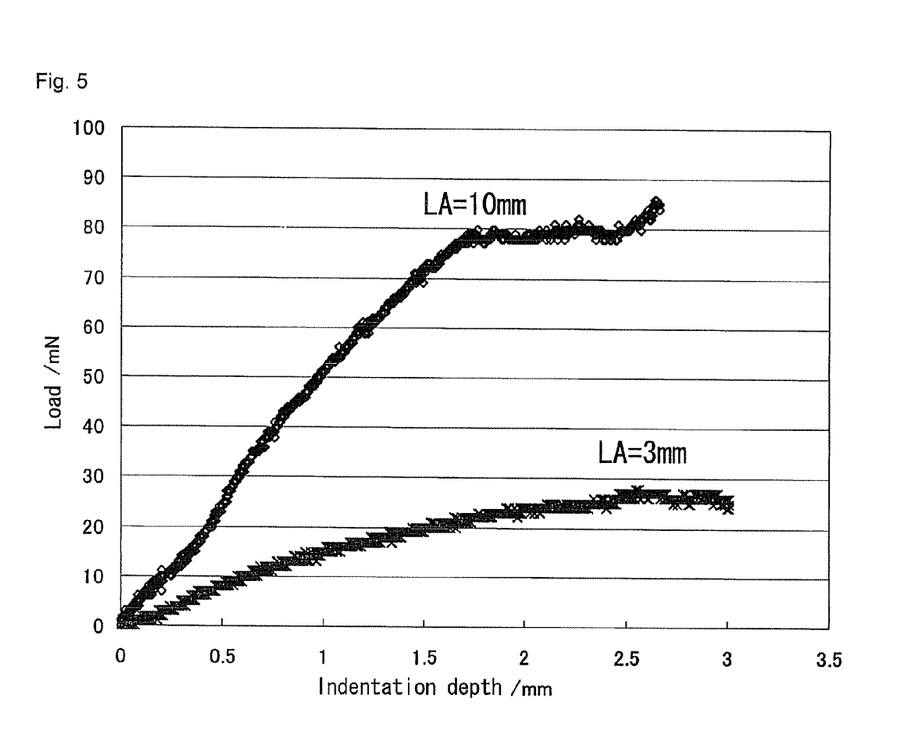
FIG. 5 is a graph showing a relation between an indentation depth and an indentation load of an indenter on an overlapped part, when a length of an epoxy based adhesive (layer) on the overlapped part is changed in a longitudinal direction.

The results obtained are shown in FIG. 5. It shows that, in Experimental case 1 where the LA was 3 mm, the indenter was indented into the overlapped part at lower load, and the rigidity of the overlapped part was low (soft). When the sample in Experimental case 1 longitudinally wrapped around the predetermined core was passed through the predetermined dies, no bulge defect was produced.

Example 3

Figure 4:
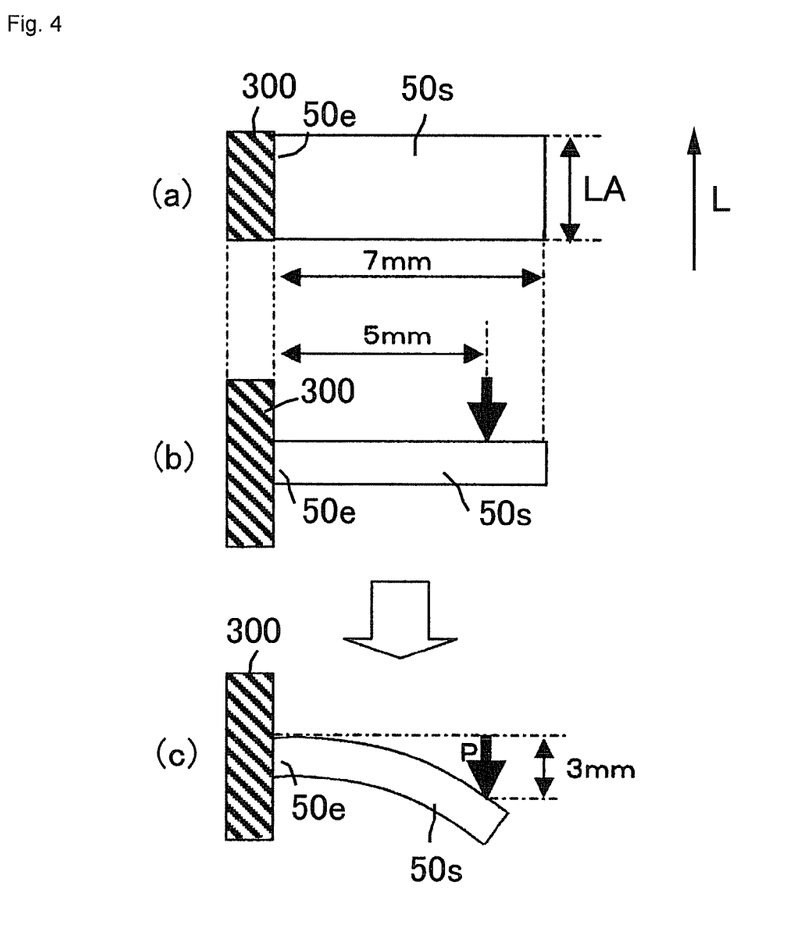
FIG. 4 shows a way to measure P.

The electromagnetic shielding materials were produced as in Example 1. The thickness of the copper foil, the thickness of the PET film, the thickness of the epoxy based adhesive layer and the LA in the electromagnetic shielding material were changed as shown in Table 2. The adhesion strength at 150° C. and the P were measured. The P was measured by cutting the rectangular piece 50s as shown in FIG. 4.

The results obtained are shown in Table 2.

|  | Copper foil (μm) | PET film (μm) | Epoxy based adhesive (μm) | Adhesion strength (N/mm) | LA (mm) | P (N/m) | P × LA (mN) | Defect |
|---|---|---|---|---|---|---|---|---|
| Experimental case 10 | 5 | 12 | 25 | 1.9 | 4 | 5 | 20 | None |
| Experimental case 11 | 6 | 12 | 25 | 1.8 | 3 | 7.5 | 22.5 | None |
| Experimental case 12 | 8 | 12 | 25 | 2.0 | 3 | 9.0 | 27 | None |
| Experimental case 13 | 8 | 12 | 25 | 2.1 | 3 | 8.3 | 24.9 | None |
| Experimental case 14 | 8 | 12 | 12 | 2.0 | 6 | 6.1 | 36.6 | None |
| Experimental case 15 | 12 | 12 | 12 | 1.8 | 3 | 11.5 | 34.5 | None |
| Experimental case 16 | 15 | 12 | 12 | 1.8 | 2 | 15 | 30 | None |
| Comparative Experimental case 10 | 8 | 12 | 25 | 1.0 | 3 | 4.0 | 12 | Concave defect |
| Comparative Experimental case 11 | 8 | 12 | 25 | 2.2 | 3 | 16.1 | 48.3 | Bulge defect |
| Comparative Experimental case 12 | 8 | 12 | 25 | 1.8 | 6 | 8.3 | 49.8 | Bulge defect |
| Comparative Experimental case 13 | 33 | 12 | 25 | 2.1 | 3 | 21 | 63 | Bulge defect |

As apparent from Table 2, in each of Experimental cases 10 to 16, P was within 5 N/m≤P/w≤15 N/m. Neither concave nor bulge defect was produced at outside of the copper foil composite.

On the other hand, in Comparative Experimental case 10 where the P value was less than 5 N/m because the thermal compression bonding temperature was lowered (130° C.) and epoxy was less cured, the adhesion strength at 150° C. was less than 1.5 N/mm, and the concave defect was produced.

In Comparative Experimental case 11 where the amount of epoxy in the epoxy based adhesive was two times greater than that in other Experimental cases, or in Comparative Experimental case 13 where the copper foil and the epoxy based adhesive layer were thick, the P exceeded 15 N/mm to increase the rigidity, and the bulge defect was produced.

In Comparative Experimental case 12 where P×LA exceeded 45 mN because the overlapped length LA did not shorten irrespective of somewhat high P, the P was less than 15 N/m, but the bulge defect was produced.

What is claimed is:

1. An electromagnetic shielding material comprising a plurality of copper foil composites connected together in a longitudinal direction, the composites having a copper foil and a resin film which are laminated, wherein the plurality of copper foil composites are connected together in a longitudinal direction such that a resin film side of one copper foil composite is overlapped with a copper foil side of another copper foil composite and such that each copper foil of the copper foil composites is not electrically connected, wherein the overlapped part of the copper foil composites is adhered with an epoxy based adhesive comprising as main components an epoxy resin and one or more of flexibility providing resins selected from the group consisting of nitrile butadiene rubber, natural rubber, styrene butadiene rubber, butadiene rubber, ethylene propylene rubber, isoprene rubber, urethane rubber and acrylic rubber, and wherein the epoxy based adhesive disposed at the overlapped part of the copper foil composites has a length (LA) in the longitudinal direction of 1 to 6 mm.

2. An electromagnetic shielding material comprising a plurality of copper foil composites connected together in a longitudinal direction, the composites having a copper foil and a resin film which are laminated, wherein the plurality of copper foil composites are connected together in a longitudinal direction such that a resin film side of one copper foil composite is overlapped with a copper foil side of another copper foil composite and such that each copper foil of the copper foil composites is not electrically connected, wherein the overlapped part of the copper foil composites is adhered with an epoxy based adhesive comprising as main components an epoxy resin and one or more of flexibility providing resins selected from the group consisting of nitrile butadiene rubber, natural rubber, styrene butadiene rubber, butadiene rubber, ethylene propylene rubber, isoprene rubber, urethane rubber and acrylic rubber, and wherein the overlapped part of the copper foil composites has adhesion strength per unit width at 150° C. of 1.5 N/mm or more.

3. The electromagnetic shielding material according to claim 1, wherein each copper foil composite has a length of at least 7 mm in a direction perpendicular to the longitudinal direction, and when a rectangular piece is cut only from the overlapped part of the copper foil composites so that the rectangular piece has long sides each having a length of 7 mm in a direction perpendicular to the longitudinal direction, and one of short sides of the rectangular piece is fixed, a force P per unit width required to deflect 3 mm a point apart 5 mm from the fixed side is 5 N/m≤P/w≤15 N/m, wherein the width corresponds to the direction perpendicular to the longitudinal direction of the electromagnetic shielding material and the force P is applied across the different layers of the rectangular piece.

4. The electromagnetic shielding material according to claim 3, wherein P×LA≤45 N·m.

5. A method of producing the electromagnetic shielding material according to claim 1, comprising the steps of:
overlapping a plurality of copper foil composites in a longitudinal direction, the composites having a copper foil and a resin film which are laminated, wherein a resin film side of one copper foil composite is overlapped with a copper foil side of another copper foil composite, and
connecting and adhering the overlapped part of the copper foil composites by inserting an epoxy based adhesive comprising one or more selected from the group consisting of nitrile butadiene rubber, natural rubber, styrene butadiene rubber, butadiene rubber, ethylene propylene rubber, isoprene rubber, urethane rubber and acrylic rubber; and an epoxy resin.

6. A method of producing the electromagnetic shielding material according to claim 2, comprising the steps of:
overlapping a plurality of copper foil composites in a longitudinal direction, the composites having a copper foil and a resin film which are laminated, wherein a resin film side of one copper foil composite is overlapped with a copper foil side of another copper foil composite, and
connecting and adhering the overlapped part of the copper foil composites by inserting an epoxy based adhesive comprising one or more selected from the group consisting of nitrile butadiene rubber, natural rubber, styrene butadiene rubber, butadiene rubber, ethylene propylene rubber, isoprene rubber, urethane rubber and acrylic rubber; and an epoxy resin.

* * * * *